United States Patent
Losiewicz

(10) Patent No.: US 9,370,924 B1
(45) Date of Patent: *Jun. 21, 2016

(54) DUAL ACTION STENCIL WIPER ASSEMBLY FOR STENCIL PRINTER

(71) Applicant: Illinois Tool Works Inc., Glenview, IL (US)

(72) Inventor: William A. Losiewicz, Douglas, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/737,171

(22) Filed: Jun. 11, 2015

Related U.S. Application Data

(63) Continuation-in-part of application No. 14/668,024, filed on Mar. 25, 2015.

(51) Int. Cl.
| | |
|---|---|
| *B41F 15/08* | (2006.01) |
| *B41F 15/18* | (2006.01) |
| *B41F 15/44* | (2006.01) |
| *B41F 15/14* | (2006.01) |
| *B41F 15/34* | (2006.01) |

(52) U.S. Cl.
CPC ............... *B41F 15/18* (2013.01); *B41F 15/08* (2013.01); *B41F 15/14* (2013.01); *B41F 15/34* (2013.01); *B41F 15/44* (2013.01)

(58) Field of Classification Search
CPC .......... B41F 15/08; B41F 15/10; B41F 15/14; B41F 15/44; B41F 15/18; B41F 15/34; B41F 15/423; H05K 3/1216

USPC .................................. 101/114, 123, 126, 129
See application file for complete search history.

(56) References Cited

U.S. PATENT DOCUMENTS

| | | |
|---|---|---|
| 3,777,661 A | 12/1973 | Aiko et al. |
| 3,874,289 A | 4/1975 | Valentin |
| 4,924,304 A | 5/1990 | Freeman |
| 5,060,063 A | 10/1991 | Freeman |
| RE34,615 E | 5/1994 | Freeman |
| 5,452,656 A | 9/1995 | Becher et al. |
| 5,491,871 A | 2/1996 | Reber et al. |
| 5,669,970 A | 9/1997 | Balog et al. |
| 5,724,889 A | 3/1998 | Aun et al. |
| 5,794,329 A | 8/1998 | Rossmeisl et al. |
| 5,807,606 A | 9/1998 | Mould et al. |

(Continued)

FOREIGN PATENT DOCUMENTS

JP 2004020984 A 1/2004

*Primary Examiner* — Blake A Tankersley
*Assistant Examiner* — Marissa Ferguson Samreth
(74) *Attorney, Agent, or Firm* — Lando & Anastasi, LLP

(57) ABSTRACT

A stencil printer includes a stencil shuttle assembly coupled to a frame. The stencil shuttle assembly is configured to move the stencil in an x-axis direction between a first position in which the stencil is positioned toward a front of the stencil printer and a second position in which the stencil is positioned toward a back of the stencil printer. The stencil shuttle assembly further is configured to move the stencil in a y-axis direction to align the stencil. The stencil printer further includes a wiper to remove material from the stencil as the stencil is translated away from the substrate by the stencil shuttle assembly. The stencil shuttle assembly, when the stencil is translated away from the substrate, is configured to move the stencil in the y-axis direction in an oscillating manner. Methods of cleaning a stencil are further disclosed.

16 Claims, 14 Drawing Sheets

(56) References Cited

U.S. PATENT DOCUMENTS

| | | | |
|---|---|---|---|
| 5,813,331 A | 9/1998 | Tan et al. | |
| 5,865,117 A | 2/1999 | Asai et al. | |
| 5,873,939 A | 2/1999 | Doyle et al. | |
| 5,882,720 A | 3/1999 | Legault et al. | |
| 5,918,544 A | 7/1999 | Doyle | |
| 5,925,187 A | 7/1999 | Freeman et al. | |
| 5,941,171 A | 8/1999 | Fromm | |
| 5,943,089 A | 8/1999 | Douglas | |
| 5,947,022 A | 9/1999 | Freeman et al. | |
| 5,991,963 A | 11/1999 | Tourigny | |
| 6,032,577 A | 3/2000 | Doyle | |
| 6,066,206 A | 5/2000 | Doyle et al. | |
| 6,067,709 A | 5/2000 | Godin et al. | |
| 6,189,448 B1 | 2/2001 | O'Neal et al. | |
| 6,207,220 B1 | 3/2001 | Doyle et al. | |
| 6,217,669 B1 | 4/2001 | Sarashina et al. | |
| 6,237,484 B1 | 5/2001 | Homma et al. | |
| 6,267,819 B1 | 7/2001 | Doyle et al. | |
| 6,324,973 B2 | 12/2001 | Rossmeisl et al. | |
| 6,374,729 B1 | 4/2002 | Doyle | |
| 6,453,810 B1 | 9/2002 | Rossmeisl et al. | |
| 6,571,701 B1 | 6/2003 | Pham-Van-Diep et al. | |
| 6,619,198 B2 | 9/2003 | Rossmeisl et al. | |
| 6,626,097 B2 | 9/2003 | Rossmeisl et al. | |
| 6,626,106 B2 | 9/2003 | Peckham et al. | |
| 6,638,363 B2 | 10/2003 | Erdmann | |
| 6,663,712 B2 | 12/2003 | Doyle et al. | |
| 6,738,505 B1 | 5/2004 | Prince | |
| 6,891,967 B2 | 5/2005 | Prince | |
| 6,955,120 B2 | 10/2005 | Pham-Van-Diep et al. | |
| 6,955,121 B2 | 10/2005 | Perault et al. | |
| 7,013,802 B2 | 3/2006 | Marszalkowski, Jr. | |
| 7,017,489 B2 | 3/2006 | Perault et al. | |
| 7,028,391 B2 | 4/2006 | Pham-Van-Diep et al. | |
| 7,040,228 B2 | 5/2006 | Perault et al. | |
| 7,072,503 B2 | 7/2006 | Prince | |
| 7,121,199 B2 | 10/2006 | Perault et al. | |
| 7,149,344 B2 | 12/2006 | Prince | |
| 7,171,898 B2 | 2/2007 | Marszalkowski, Jr. | |
| 7,249,558 B2 | 7/2007 | Claiborne | |
| 7,293,691 B2 | 11/2007 | Rossmeisl et al. | |
| 7,310,438 B2 | 12/2007 | Prince | |
| 7,322,288 B2 | 1/2008 | Marszalkowski, Jr. | |
| 7,458,318 B2 | 12/2008 | Prince | |
| 7,469,635 B2 | 12/2008 | Marszalkowski, Jr. | |
| 7,549,371 B2 | 6/2009 | Willshere et al. | |
| 7,710,611 B2 | 5/2010 | Prince | |
| 7,806,048 B2 | 10/2010 | Doyle | |
| 7,827,909 B2 | 11/2010 | Mattero et al. | |
| 7,861,650 B2 | 1/2011 | Klauser et al. | |
| 7,878,116 B2 | 2/2011 | Barboza et al. | |
| 7,987,781 B2 | 8/2011 | Doyle et al. | |
| 8,230,783 B2 | 7/2012 | Klauser et al. | |
| 8,230,784 B2 | 7/2012 | Doyle | |
| 8,230,785 B2 | 7/2012 | Doyle et al. | |
| 8,253,355 B2 | 8/2012 | Mattero et al. | |
| 8,413,577 B2 | 4/2013 | Doyle | |
| 8,413,578 B2 | 4/2013 | Doyle | |
| 8,474,377 B2 | 7/2013 | Doyle | |
| 8,555,783 B2 | 10/2013 | Doyle | |
| 8,555,784 B2 | 10/2013 | Doyle | |
| 8,613,134 B2 | 12/2013 | Doyle | |
| 8,733,244 B2 | 5/2014 | Doyle | |
| 8,739,699 B2 | 6/2014 | Doyle | |
| 8,746,139 B2 | 6/2014 | Doyle | |
| 8,746,142 B2 | 6/2014 | Perault et al. | |
| 8,776,684 B2 | 7/2014 | Doyle | |
| 8,939,073 B2 | 1/2015 | Lynch et al. | |
| 8,939,074 B2 | 1/2015 | Prince | |
| 8,939,076 B2 | 1/2015 | Doyle | |
| 9,060,437 B2 | 6/2015 | Bloom et al. | |
| 9,126,280 B2 | 9/2015 | Lynch et al. | |
| 2001/0017086 A1 | 8/2001 | Takahashi et al. | |
| 2002/0019680 A1 | 2/2002 | Nishikawa et al. | |
| 2002/0148374 A1 | 10/2002 | Peckham et al. | |
| 2003/0021886 A1 | 1/2003 | Baele | |
| 2005/0183593 A1* | 8/2005 | Marszalkowski | B41M 1/12 101/129 |
| 2007/0051253 A1 | 3/2007 | Marszalkowski | |
| 2009/0205569 A1 | 8/2009 | Perault et al. | |
| 2009/0255426 A1 | 10/2009 | Doyle et al. | |
| 2009/0301324 A1 | 12/2009 | Perault et al. | |
| 2010/0125357 A1 | 5/2010 | Doyle | |
| 2011/0219966 A1* | 9/2011 | Willshere | B41F 15/423 101/123 |
| 2012/0145013 A1* | 6/2012 | Doyle | B41F 15/12 101/123 |
| 2013/0333206 A1 | 12/2013 | Doyle | |
| 2015/0090134 A1 | 4/2015 | Li et al. | |

* cited by examiner

DUAL ACTION STENCIL WIPER ASSEMBLY FOR STENCIL PRINTER

RELATED APPLICATION

This application is a Continuation-In-Part of U.S. patent application Ser. No. 14/668,024, filed on Mar. 25, 2015, entitled "STENCIL PRINTER HAVING STENCIL SHUTTLE ASSEMBLY," which is hereby incorporated by reference in its entirety for all purposes.

BACKGROUND OF THE DISCLOSURE

In manufacturing a surface-mount printed circuit board, a stencil printer can be used to print solder paste onto the circuit board. Typically, a circuit board having a pattern of pads or some other conductive surface onto which solder paste will be deposited is automatically fed into the stencil printer; and one or more small holes or marks (known as "fiducials") on the circuit board are used to properly align the circuit board with the stencil or screen of the stencil printer prior to printing solder paste onto the circuit board. In some systems, an optical alignment system embodying a vision system is used to align the circuit board with the stencil.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the circuit board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste typically is dispensed onto the stencil from a standard cartridge. The stencil is then separated from the circuit board and the adhesion between the circuit board and the solder paste causes most of the material to stay on the circuit board. Material left on the surface of the stencil is removed in a cleaning process before additional circuit boards are printed.

Another process in the printing of circuit boards involves inspection of the circuit boards after solder paste has been deposited on the surface of the circuit boards. Inspecting the circuit boards is important for determining that clean electrical connections can be made. An excess of solder paste can lead to shorts, while too little solder paste in appropriate positions can prevent electrical contact. Generally, the vision inspection system is further employed to provide a two-dimensional or a three-dimensional inspection of the solder paste on the circuit board.

The stencil cleaning process and the circuit board inspection process are merely two of a number of processes involved in producing circuit boards. To produce the greatest number of circuit boards of consistent quality, it is often desirable to reduce the cycle time necessary to manufacture circuit boards, while maintaining systems that ensure the quality of the circuit boards produced, such as the circuit board inspection and stencil cleaning systems. It is further desirable to improve the effectiveness of wiping and cleaning the stencil during a stencil wipe operation.

SUMMARY OF THE DISCLOSURE

One aspect of the present disclosure is directed to a stencil printer for printing viscous materials on electronic substrates. In one embodiment, the stencil printer comprises a frame and an electronic substrate support coupled to the frame. The electronic substrate support is configured to support an electronic substrate and move the electronic substrate between a lowered position and a raised position. The stencil printer further comprises a stencil shuttle assembly coupled to the frame. The stencil shuttle assembly is configured to support a stencil and to move the stencil in an x-axis direction between a first position in which the stencil is positioned toward a front of the stencil printer and a second position in which the stencil is positioned toward a back of the stencil printer. The stencil shuttle assembly further is configured to move the stencil in a y-axis direction to align the stencil. The stencil printer further comprises a print head coupled to the frame, with the print head being configured to engage the stencil to dispense a material onto the substrate during a print stroke. The stencil printer further comprises a wiper to remove material from the stencil as the stencil is translated away from the substrate by the stencil shuttle assembly. The stencil shuttle assembly, when the stencil is translated away from the substrate, is configured to move the stencil in the y-axis direction in an oscillating manner.

Embodiments of the stencil printer further may include a vision system coupled frame to inspect a surface of the substrate. The stencil printer further may include a controller coupled to the vision system, the first, second and third actuators, and the at least one clamp to move and secure the staging frame with respect to the stencil shuttle in an x-direction, a y-direction and a rotational direction to align the substrate. The stencil shuttle assembly further may include a first pivot pin provided on the staging frame and configured to receive the first actuator, a second pivot pin provided on the staging frame and configured to receive the second actuator, and a third pivot pin provided on the staging frame and configured to receive the third actuator, the first, second and third pivot pins being configured to position the stencil shuttle with respect to the staging frame via the first, second and third actuators. The stencil shuttle assembly may include a staging frame configured to receive and secure the stencil thereto, and a stencil shuttle coupled to the frame and to the staging frame to move the staging frame and the stencil. The stencil shuttle assembly further may include a first actuator configured to move the staging frame with respect to the stencil shuttle in a first direction, a second actuator configured to move the staging frame with respect to the stencil shuttle in a second direction, the second direction being generally perpendicular to the first direction, and a third actuator configured to move the staging frame with respect to the stencil shuttle in the first direction. The first, second and third actuators may be configured to align the stencil and configured to move the stencil in the y-axis direction when translating the stencil. The first, second and third actuators may be energized individually or in a synchronized manner to generate a dual action wiping motion, which increases relative motion between wiper paper of the stencil wiper and a bottom surface of the stencil. The stencil shuttle assembly further may include at least one clamp to clamp the staging frame to the stencil shuttle. Rotational direction of movement may be achieved by adjusting the first and third actuators. The stencil shuttle assembly further may include two shuttle supports coupled to the frame and configured to secure the stencil shuttle to the frame. The stencil shuttle assembly further may include at least one clamp to clamp the stencil shuttle to the two shuttle supports. The stencil printer further may comprise a drive assembly coupled to the frame and the print head, the drive assembly being configured to move the print head to perform the print stroke and configured to selectively move the stencil shuttle frame between the first and second positions.

Another aspect of the disclosure is directed to a method of dispensing viscous material onto an electronic substrate and of cleaning a stencil. In one embodiment, the method comprises: transporting the electronic substrate to a print position; moving a vision system over the electronic substrate to obtain electronic substrate and stencil fiducial locations; performing an x-axis, y-axis and rotational adjustment of the stencil position with actuators to precisely align fiducial locations of the stencil with fiducial locations of the electronic substrate; performing a print stroke with a print head over the stencil to force solder paste through apertures in the stencil onto the electronic substrate; selectively engaging shuttle transport clamps to rigidly couple the print head to a stencil shuttle assembly that supports the stencil; moving the print head and the stencil in an x-axis direction toward a stencil wiper assembly to initiate a stencil wipe operation in which the stencil wiper assembly cleans an underside of the stencil; and moving the stencil in the y-axis direction in an oscillating manner.

Embodiments of the method further may include moving the print head in an opposite direction to the print position during the stencil wipe operation. The method further may include raising the stencil wiper assembly to a wipe height. Moving the stencil in the y-axis direction includes energizing first, second and third actuators of a stencil shuttle assembly individually or in a synchronized manner to generate a dual action wiping motion. The method further may include lifting the electronic substrate to a vision height by prior to moving a vision system over the electronic substrate. The vision system may move to a park location after obtaining the electronic substrate and stencil fiducial locations. The method further may include lifting the electronic substrate to a print height prior to performing a print stroke. Performing a print stroke may include lowering a squeegee blade of the print head prior to the print stroke toward the stencil so that the squeegee blade engages the stencil and raising the squeegee blade after the print stroke away from the stencil.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

The present disclosure relates generally to material application machines (referred to herein as "stencil printers," "screen printers," "printing machines," or "printers") and other equipment utilized in a surface mount technology (SMT) process lines and configured to apply an assembly material (e.g., solder paste, conductive ink, or encapsulation material) onto a substrate (e.g., a printed circuit board, referred to herein as an "electronic substrate," a "circuit board," a "board," a "PCB," a "PCB substrate," a "substrate," or a "PCB board") or to perform other operations, such as inspection, rework, or placement of electronic components onto a substrate. Specifically, embodiments of the present disclosure are described below with reference to stencil printers used to produce printed circuit boards.

Embodiments of a stencil printer disclosed herein is capable of driving the movement of a print head and a stencil shuttle assembly carrying a stencil in a y-axis direction within the stencil printer with a single drive assembly. The stencil shuttle assembly employs stencil shuttle clamps that are configured to secure the stencil shuttle assembly to the print head to drive the synchronized y-axis movement of the print head and the stencil shuttle assembly when performing a stencil wipe operation. The stencil shuttle assembly further employs shuttle position clamps to secure the stencil shuttle assembly to a frame of the stencil printer and frame position clamps to secure the stencil when performing a print operation with the print head. In this configuration, the stencil shuttle clamps are disengaged to enable the print head to move relative to the stencil shuttle assembly. The configuration of the stencil printer enables simultaneous operations, such as vision inspection of a completed circuit board while cleaning the stencil, or unloading a completed circuit board and loading and aligning a new circuit board while cleaning the stencil.

Figure 1:
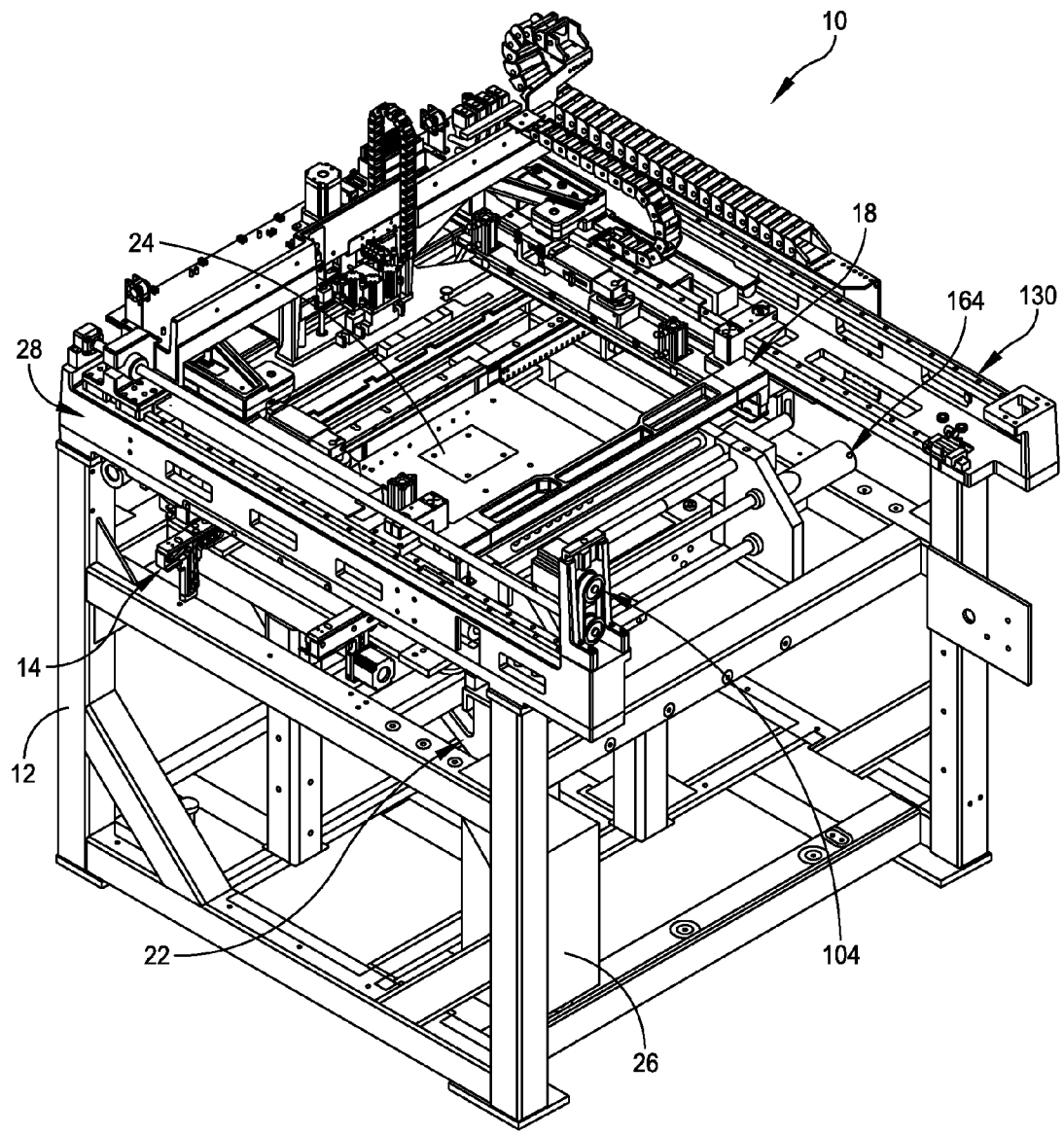
FIG. 1 is a front perspective view of a stencil printer of an embodiment of the present disclosure with external packaging removed to reveal the primary operating systems of the stencil printer.

Referring now to the drawings, and more particularly to FIG. 1, there is generally indicated at 10 a stencil printer of an embodiment of the disclosure. As shown, the stencil printer 10 includes a frame 12 that supports components of the stencil printer. The components of the stencil printer 10 includes, in part, a conveyor system, generally indicated at 14, a stencil 16, which is not shown in FIG. 1 for clarity, but shown in FIGS. 4 and 5, a stencil shuttle assembly, generally indicated at 18, and a print head assembly or print head, generally indicated at 20, which together are configured to apply viscous materials, including solder paste, in a manner described in greater detail below.

The stencil printer 10 further includes a lift table assembly, generally indicated at 22, which is configured to raise a circuit board 24 delivered by the conveyor system 14 from a lower position in which the circuit board lies along the same plane as the conveyor system to a raised or print position in which the circuit board engages the stencil. The lift table assembly 22 is further configured to lower the circuit board 24 from the print position back to the lower position. The stencil printer 10 further may include a controller 26 and a keyboard and a display (not shown) to enable an operator or assembly system to control the operation of the stencil printer.

Figure 2:
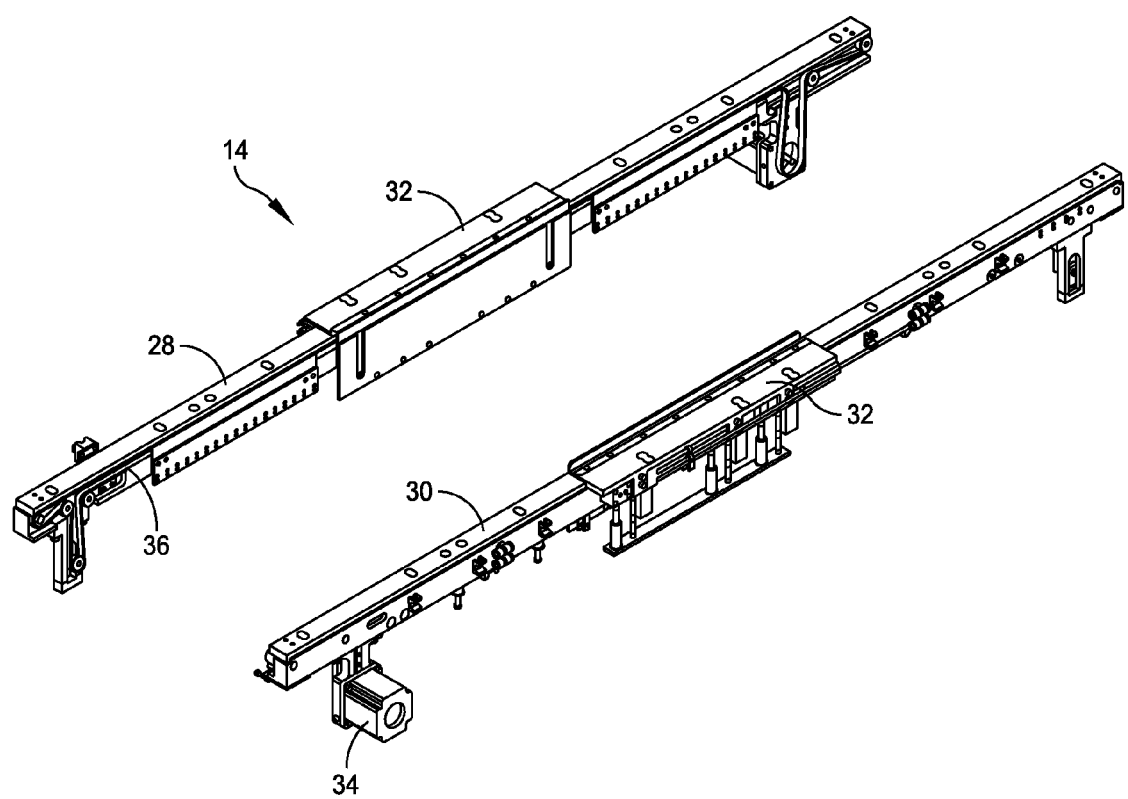
FIG. 2 is a perspective view of a conveyor system of the stencil printer.

Referring to FIG. 2, the conveyor system 14 of the stencil printer 10 includes two transport rails, generally indicated at 28, 30, to transport the printed circuit board 24 to the print position in the stencil printer. The transport rails 28, 30 sometimes may be referred to as a "tractor feed mechanism," which together are configured to feed, load or otherwise deliver circuit boards to the working area of the stencil printer 10, which may be referred to herein as a "print nest," and to unload circuit boards from the print nest.

Each transport rail 28, 30 include a board lifter 32 that is configured to engage and support the underside of the circuit board 24 during a print operation. Each transport rail 28, 30 further include a motor 34 and a transport belt 36 coupled to the motor. The arrangement is such that the motors 34 of the transport rails 28, 30 drive the synchronized movement of the transport belts 36 to move the circuit board 24 to and from the print nest under the control of the controller 26.

Figure 3:
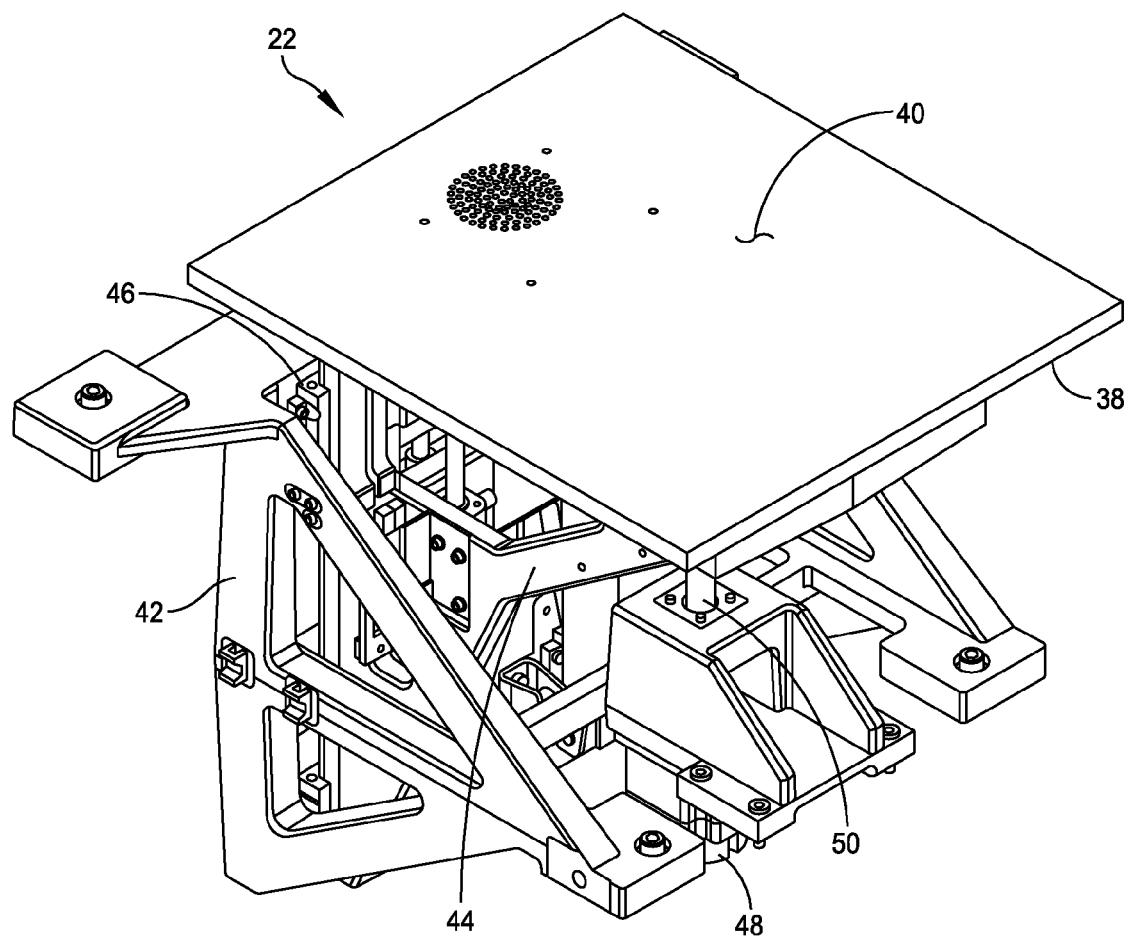
FIG. 3 is a perspective view of a lift table assembly of the stencil printer.

Referring to FIG. 3, in the embodiment disclosed herein, the print nest is embodied by the lift table assembly 22, which includes a support table 38 having a support surface 40 on which the circuit board 24 is supported. The lift table assembly 22 includes a stationary frame structure 42 that is secured to the frame 12 of the stencil printer 10 and a movable frame structure 44 that supports the support table 38 to move the support table upwardly and downwardly. Linear bearings 46 enable the relative movement of the movable frame structure 44 upwardly and downwardly with respect to the stationary frame member 42.

The lift table assembly 22 further includes a lift table motor 48 and a lift table ball screw 50 to drive the upward and downward movement of the movable frame structure 44, including the support table 38. The result is that the support table 38 is moved upwardly and downwardly by operating the motor 48 under the control of the controller 26. The support table 38 may further include substrate support system, e.g., a solid support, a plurality of pins or flexible tooling, which is positioned beneath the circuit board 24 when the circuit board is in the print position. The substrate support system may be used, in part, to support the interior regions of the circuit board 24 to prevent flexing or warping of the circuit board during the print operation.

Figure 4:
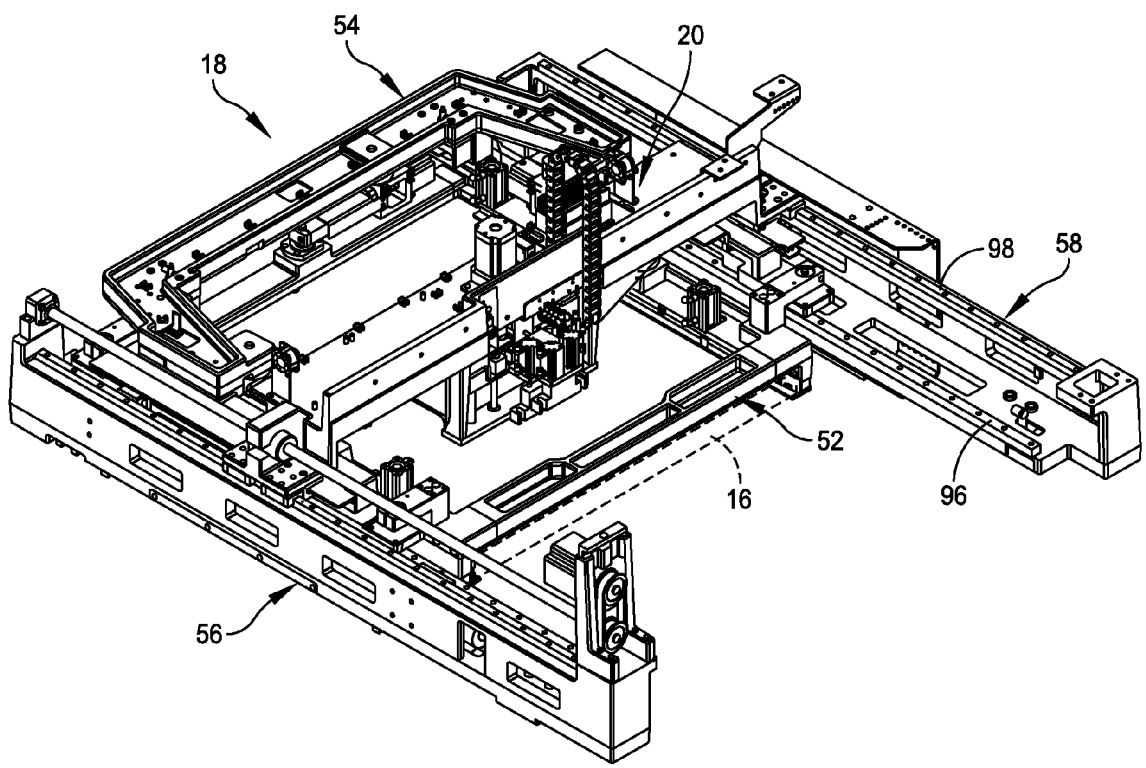
FIG. 4 is a perspective view of a stencil shuttle assembly of the stencil printer prior to performing a print stroke.
Figure 5:
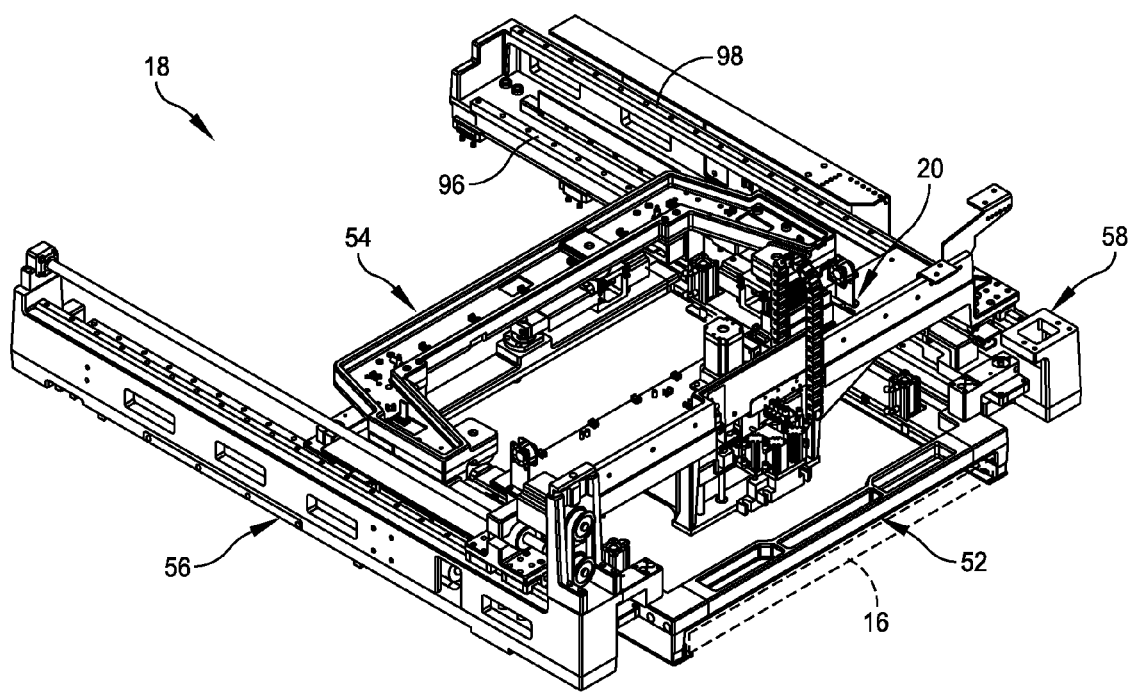
FIG. 5 is a perspective view of the stencil shuttle assembly in a print position and prior to performing a stencil wipe operation.

Referring to FIGS. 4 and 5, the stencil shuttle assembly 18 is configured to move the stencil 16 (shown in dashed lines) from a first position toward a back of the stencil printer 10 in which the stencil is positioned to perform a print operation and a second position toward a front of the stencil printer in which the stencil is positioned to perform a stencil wipe operation on the stencil. As shown, the stencil shuttle assembly 18 includes a staging frame, generally indicated at 52, which is configured to support the stencil 16, a stencil shuttle, generally indicated at 54, which is secured to the staging frame 52, and left and right shuttle supports, generally indicated at 56, 58, respectively, which are secured to the frame 12 and provide guided tracks for the stencil shuttle to ride upon. As will be described in greater detail below, the arrangement is such that the stencil shuttle 54 is locked in place during the print stroke to prevent the stencil shuttle from moving during the print stroke.

Figure 6:
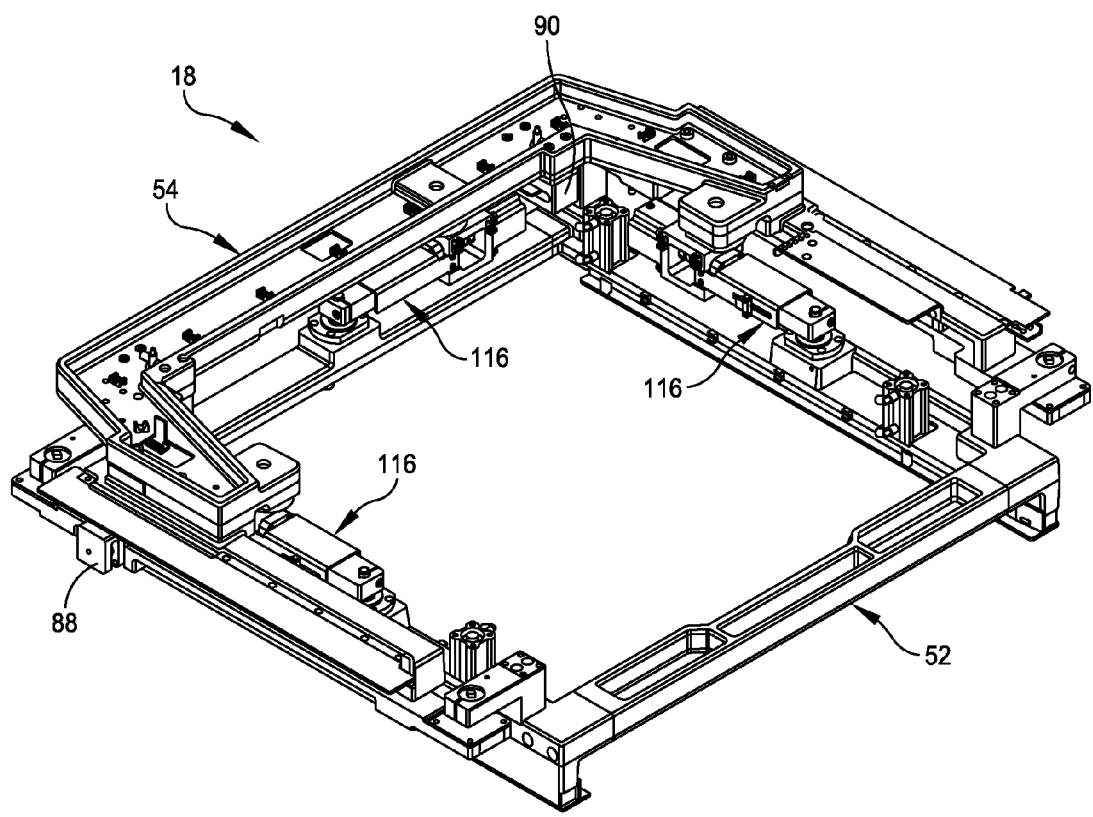
FIG. 6 is a perspective view of the stencil shuttle assembly removed from shuttle supports.

Referring to FIG. 6, the staging frame 52 and the stencil shuttle 54 are shown apart from the left and right shuttle supports 56, 58 and the print head 20. As will be described in detail below, the staging frame 52 of the stencil shuttle assembly 18 is configured to be selectively clamped to the stencil shuttle 54 to firmly secure the staging frame during a stencil print operation once the stencil 16 is aligned with the circuit board 24. In addition, the stencil shuttle 54 of the stencil shuttle assembly 18 is configured to be selectively clamped to the left and right shuttle supports 56, 58 when it is desired to move the stencil shuttle assembly when powering the movement of the print head 20.

Figure 7:
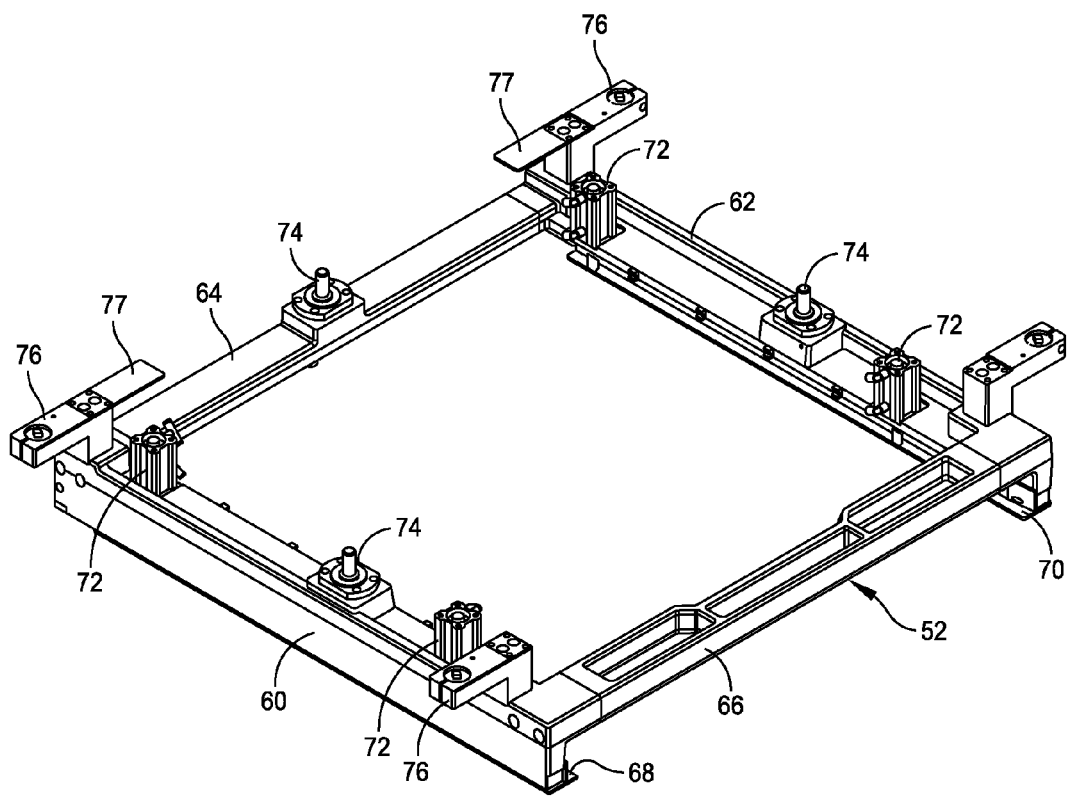
FIG. 7 is a perspective view of a stencil staging frame of the stencil shuttle assembly.

Referring to FIG. 7, the staging frame 52 is shown apart from the rest of the components of the stencil shuttle assembly 18. As shown, the staging frame 52 includes four rail members 60, 62, 64, 66, which together form a generally rectangular structure. The rail members 60, 62, 64, 66 are secured to one another at their respective corners, as by welding, for example, to form the structure. Rail member 60 includes an inwardly projecting shelf 68 and rail member 62 includes a corresponding inwardly projecting shelf 70. The arrangement is such that a stencil frame of the stencil 16 is inserted or loaded into the space provided above the shelves 68, 70 so that the shelves support the stencil during operation of the stencil printer 10.

The staging frame 52 further includes four pneumatic cylinders, each indicated at 72, which are configured to engage the staging frame of the stencil 16 under the control of the controller 26 to firmly secure the stencil to the staging frame. As shown, two pneumatic cylinders 72 are provided on rail member 60 and two pneumatic cylinders are provided on rail member 62. When activated, the pneumatic cylinders 70 engage the stencil frame of the stencil 16 to secure the stencil frame in place. When deactivated, the pneumatic cylinders 70 disengage the stencil frame of the stencil 16 to enable the removal of the stencil from the staging frame 52.

The staging frame 52 further includes three pivot pins, each indicated at 74, that are coupled to the stencil shuttle 54 by way of actuators, which will be described in greater detail below. Additionally, the staging frame 52 includes four bearing supports, each indicated at 76, which are provided at the corners of the staging frame. The bearing supports 76 extend outwardly from a periphery defined by the rail members 60, 62, 64, 66 to support the staging frame 52 on bearing support plates provided on the stencil shuttle. The staging frame 52 further includes four clamp plates 77 that extend inwardly from respective bearing supports 76. The clamp plates 77 are used to secure the staging frame 52 to the stencil shuttle 54 to ensure that the staging frame is prohibited from moving during a print operation.

Figure 8:
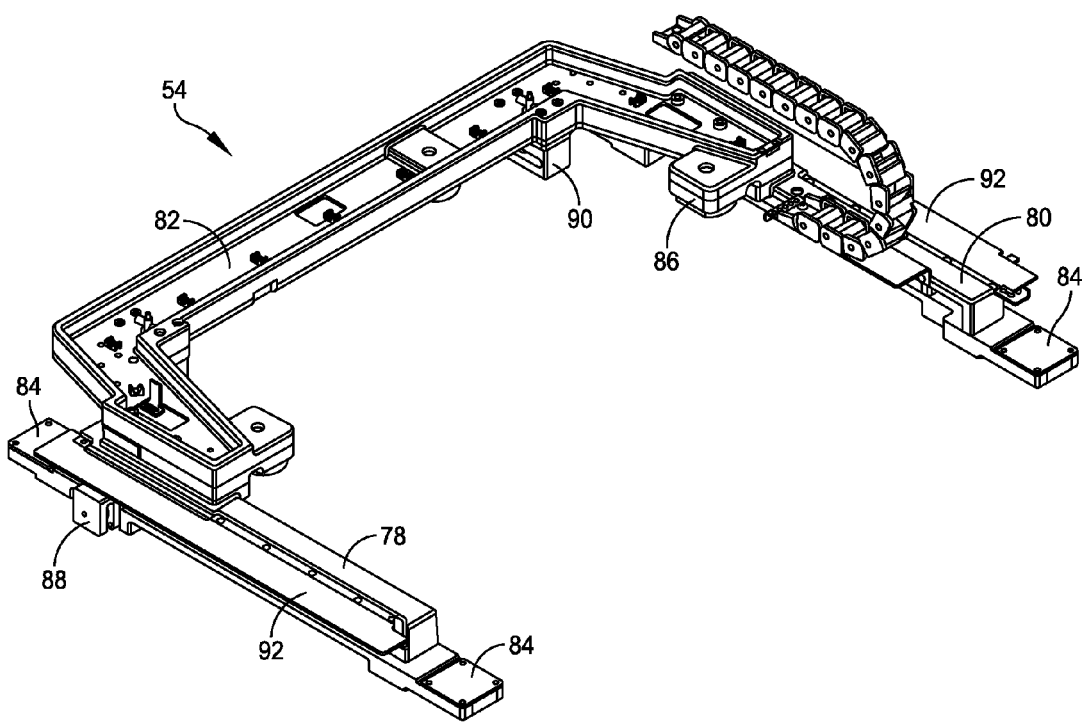
FIG. 8 is a perspective view of a stencil shuttle of the stencil shuttle assembly.

Referring to FIG. 8, the stencil shuttle 54 includes two support members 78, 80 that are connected to one another by a cross support member 82. As shown, each support member 78, 80 have support plates, each indicated at 84, provided at opposite ends of the support member. The support plates 84 are connected to the bearing supports 76 of the staging frame 52. The stencil shuttle 54 further includes three pivot pin supports, each indicated at 86, which are coupled to the pivot pins 74 of the staging frame 52 by way of the actuators, which provide relative adjustment between the stencil shuttle and the staging frame.

The stencil shuttle 54 further includes two shuttle position clamps, with one shuttle position clamp 88 shown in FIG. 8, which are configured to selectively secure the left and right support members 78, 80 to their respective left and right shuttle supports 56, 58. The stencil shuttle 54 further includes two frame position clamps, each indicated at 90, which are configured to selectively secure and stabilize the staging frame 52 during printing. The stencil shuttle 54 further includes a clamp plate 92 that is selectively secured by shuttle transport clamps associated with the print head to secure the stencil shuttle to the print head 20.

Figure 9:
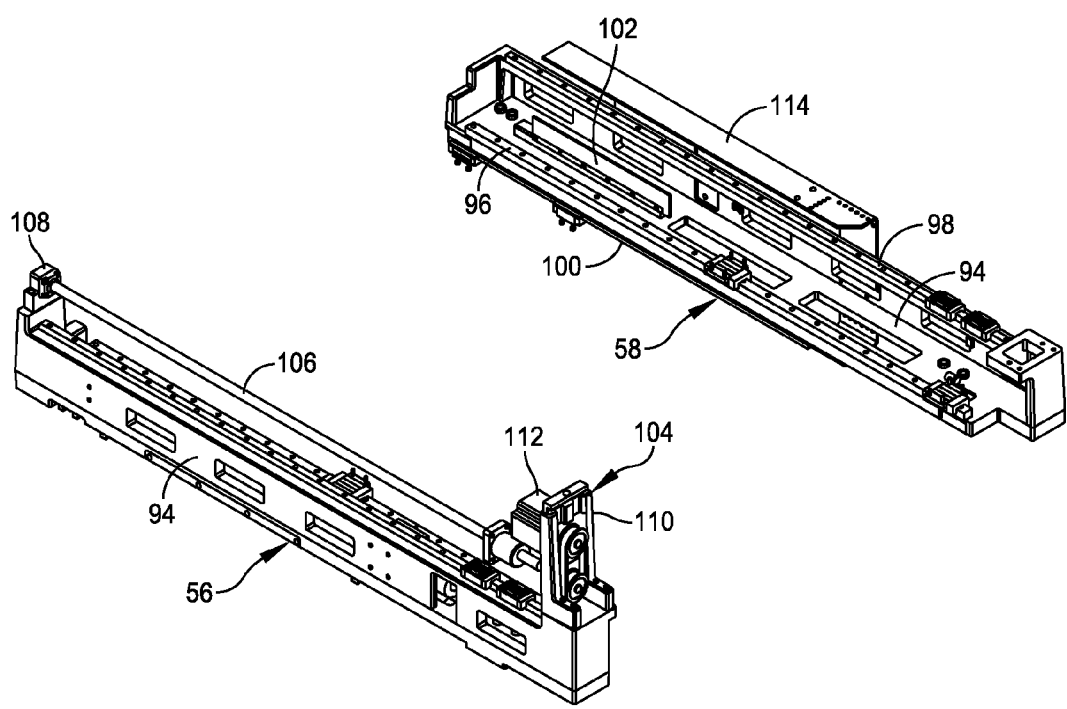
FIG. 9 is a perspective view of shuttle supports of the stencil printer.

Referring to FIG. 9, the left and right shuttle supports 56, 58 are shown apart from the remainder of the stencil shuttle assembly 18. As shown, each shuttle support 56, 58 are constructed similarly to one another with the differences described below. Each shuttle support 56, 58 include an elongated body 94 having a stencil shuttle linear bearing 96 upon which the support members 78, 80 of the stencil shuttle 54 ride during operation. The elongated body 94 of each shuttle support 56, 58 further includes a print head linear bearing 98 provided on a top of the body upon which the print head 20 rides during operation. The elongated body 94 of each shuttle support 56, 58 further includes a vision system linear bearing 100 provided on the bottom of the body upon which a vision gantry of a vision system rides during operation. The elongated body 94 of each shuttle support 56, 58 further includes a clamp plate 102 that is selectively secured by the shuttle position clamps 88 of the stencil shuttle 54 to secure the stencil shuttle to the left and right shuttle supports.

The left shuttle support 56 is provided a drive assembly, generally indicated at 104, which is configured to move the print head 20 to perform the print stroke and configured to selectively move the stencil shuttle assembly 18 between the first and second positions. As shown, the drive assembly 104 includes a ball screw 106 that is rotatably mounted on supports 108, 110 provided at the ends of the elongated body 94 of the left shuttle support 56 and a stepper motor 112 to drive the rotation of the ball screw under the control of the controller 26. The stepper motor 112 drives both the print head 20 and the stencil shuttle 54 of the stencil shuttle assembly 18 when the frame position clamps 90 are engaged. To move the stencil shuttle assembly 18 for a stencil wipe operation, shuttle transport clamps associated with the print head 20 are engaged and the shuttle position clamps 88 are disengaged. Thus, the print head 20 moves in concert with the stencil shuttle assembly 18. As mentioned above, the print head 20 and the stencil shuttle assembly 18 are configured to be driven by the drive assembly 104 under the control of the controller 26. The right shuttle support 58 includes a cable carrier 114 that houses the cables associated with the stencil shuttle assembly 18.

As mentioned above, the stencil shuttle assembly 18 includes three actuators to adjust the position of the staging frame 52 when aligning the stencil 16 with the circuit board 24. Coordinated movement of the actuators precisely positions the staging frame 52 in the x-axis and y-axis direction as well as the rotation of the staging frame in the x-y plane (theta) during operation of the stencil printer 10.

Figure 10:
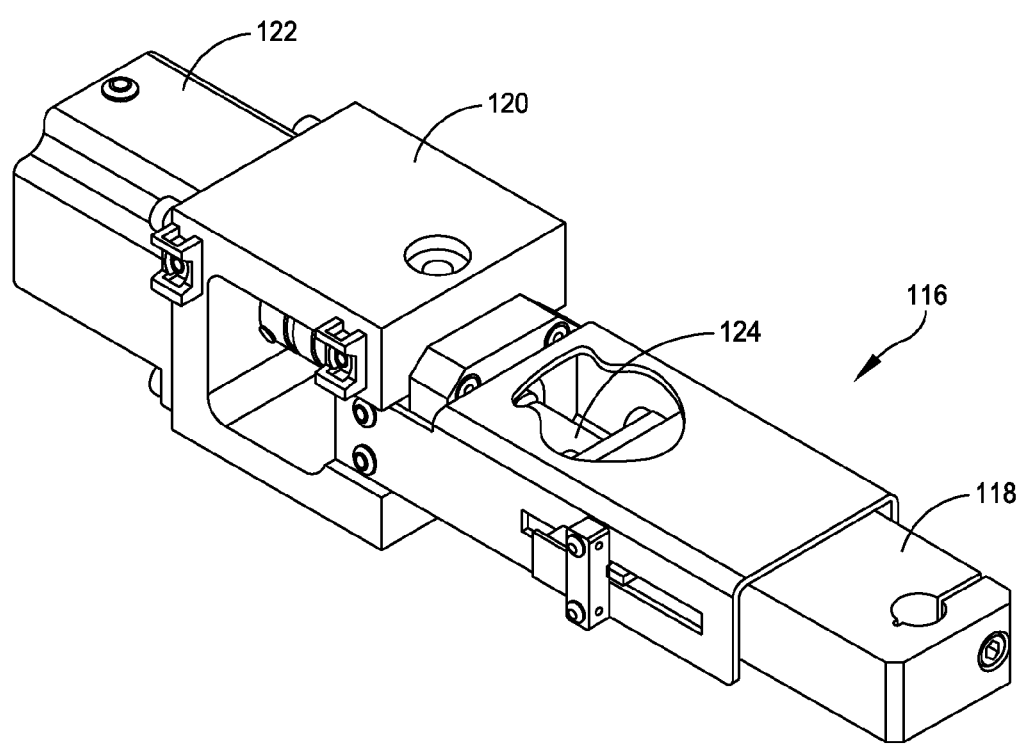
FIG. 10 is a perspective view of a staging frame actuator of the stencil shuttle assembly.

Referring to FIG. 10, the actuator is generally indicated at 116. As shown, the actuator 116 includes a first portion 118 that is secured to the frame pivot pin 74 of the staging frame 52 and a second portion 120 that is secured to the stencil shuttle 54. In one embodiment, the second portion 120 embodies a bellows shaft coupling. The actuator 116 further includes a stepper motor 122 secured to the second portion 120 and a ball screw 124 provided between the first portion 118 and the second portion. The ball 124 screw is driven by the stepper motor 122 to increase and decrease a space between the first and second portions 118, 120, thereby adjusting the staging frame 52 with respect to the stencil shuttle 54. It should be noted that very fine adjustments can be made between the staging frame 52 and the stencil shuttle 54 with the three actuators 116 provided in the stencil shuttle assembly 18.

Figure 11:
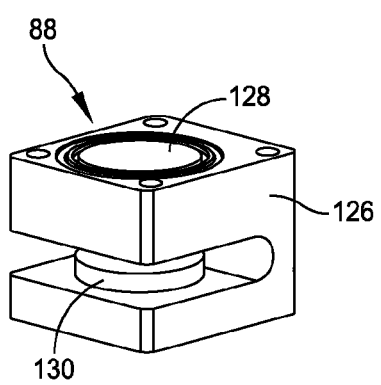
FIG. 11 is a perspective view of a shuttle position clamp of the stencil printer.
Figure 12:
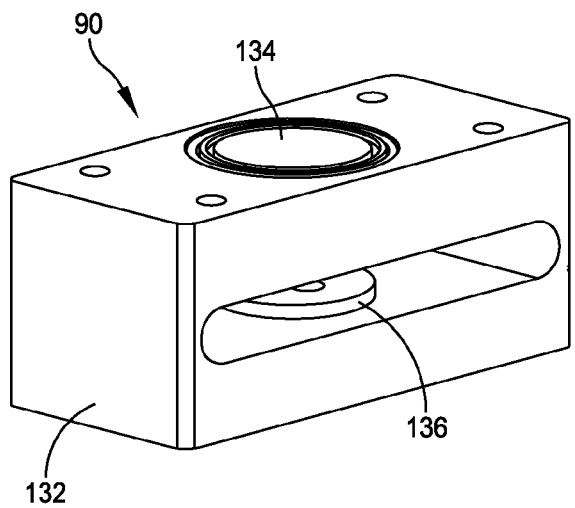
FIG. 12 is a perspective view of a frame position clamp of the stencil printer.

Referring to FIGS. 11 and 12, the shuttle position clamp 88 and the frame position clamp 90 are respectively shown. The shuttle position clamp 88 includes a body housing a piston 128 that is pneumatically actuated and a friction puck 130, which is positioned to engage the piston. The arrangement is such that the piston 128 secures the clamp plate 102 of the shuttle support 56 or 58 therebetween to secure the stencil shuttle to the shuttle support. Similarly, the frame position clamp 90 includes a body 132 housing a piston 134 that is pneumatically actuated and a friction puck 136, which is positioned to engage the piston. As with the shuttle position clamp 88, the piston of the frame position clamp 90 secures the clamp plate 77 of the staging frame 52 to secure the staging frame and the stencil 16 during a print operation to prevent the staging frame and stencil from moving.

Figure 13:
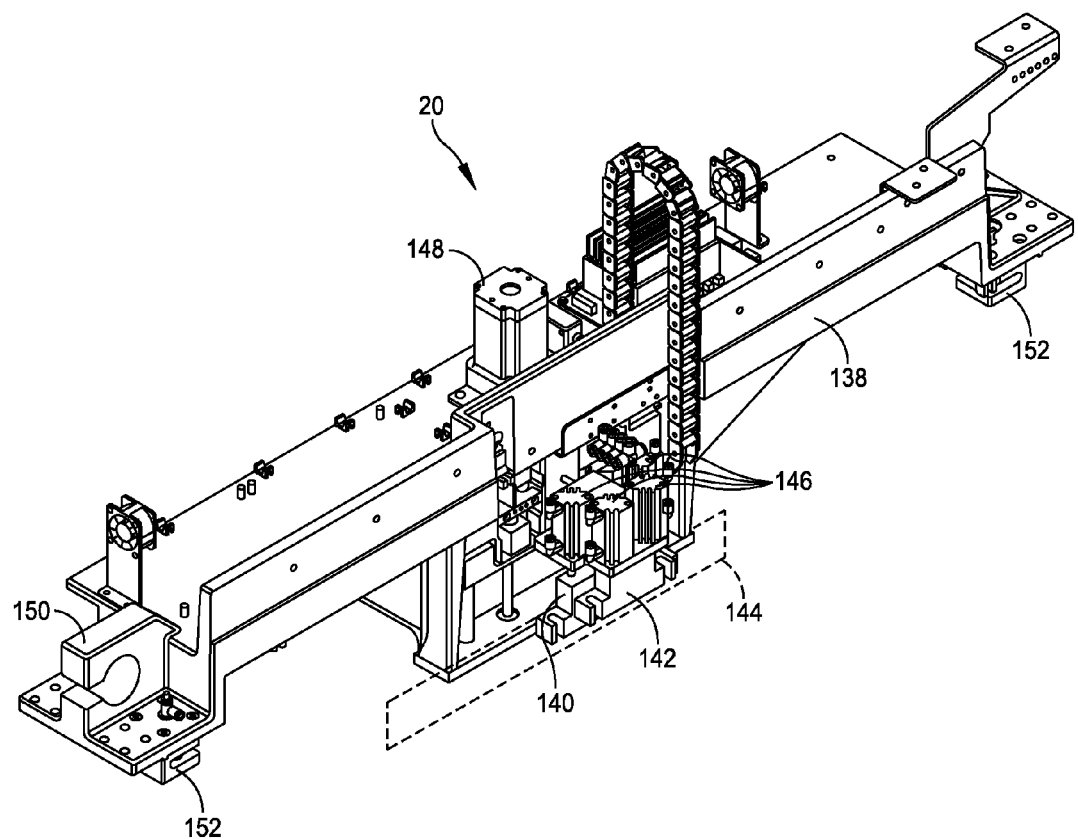
FIG. 13 is a perspective view of a print head assembly of the stencil printer.

Referring to FIG. 13, the print head 20 is shown, with reference to the stencil printer 10 shown in FIG. 1. As shown, the print head 20 is suitably coupled or otherwise connected to the frame 12 of the stencil printer 10. In one embodiment, the print head 20 includes an elongated beam 138 that is mounted on the print head linear bearings 98 provided on the left and right shuttle supports 56, 58. The configuration of the print 20 head enables the print head to be moved in the y-axis direction under the control of the controller 26 and to apply pressure on the print head as it engages the stencil 16. As described below in further detail, the print head 20 may be placed over the stencil 16 and may be lowered in the z-axis direction into contact and sealingly engage the stencil.

In one embodiment, the print head 20 may be configured to receive viscous material, e.g., solder paste, from a source, such as a dispenser, e.g., a solder paste cartridge, that provides solder paste to the print head during the print operation. Other methods of supplying solder paste may be employed in place of the cartridge. For example, solder paste may be manually deposited between squeegee blades of the print head 20 or from an external source.

Additionally, in a certain embodiment, the controller 26 may be configured to use a personal computer having a suitable operating system, such as a Microsoft DOS or Windows XP operating system, with application specific software to control the operation of the stencil printer 10 and the dispensing of viscous material, e.g., solder paste, from the print head 20. The controller 26 may be networked with a master controller that is used to control a production line for fabricating circuit boards.

The print head 20 includes front and rear squeegee blade mounting brackets which are configured to secure squeegee blades to the print head. FIG. 13 illustrates the front and rear mounting brackets 140, 142 that are configured to mount squeegee blades. FIG. 13 illustrates a single squeegee blade 144 in dashed lines mounted on mounting bracket 142. The front and rear squeegee blade mounting brackets 140, 142 are operated by four pneumatic actuators, each indicated at 146, with two pneumatic actuators being provided for each mounting bracket 140, 142, to move the mounting brackets upwardly and downwardly under the control of the controller 26. A stepper motor 148 is provided to drive the movement of the pneumatic actuators 146 and thus the mounting brackets 140, 142 and squeegee blades 144.

The print head 20 further includes a ball screw nut 150 secured to the print head. The ball screw nut 150 is threaded onto the ball screw 106 of the drive assembly 104 to power the movement of the print head 20 along the print head linear bearing 98 under the control of the controller 26. The print head 20 further includes two shuttle transport clamps, each indicated at 152, which are configured to selectively secure the print head to the stencil shuttle 54. The shuttle transport clamps 152 are constructed similarly to the shuttle position clamps 88 and the frame position clamps 90, with the shuttle transport clamps operating to engage the clamp plates 92 of the stencil shuttle 54 when it is desired to move the stencil shuttle with the print head 20.

Figure 14:
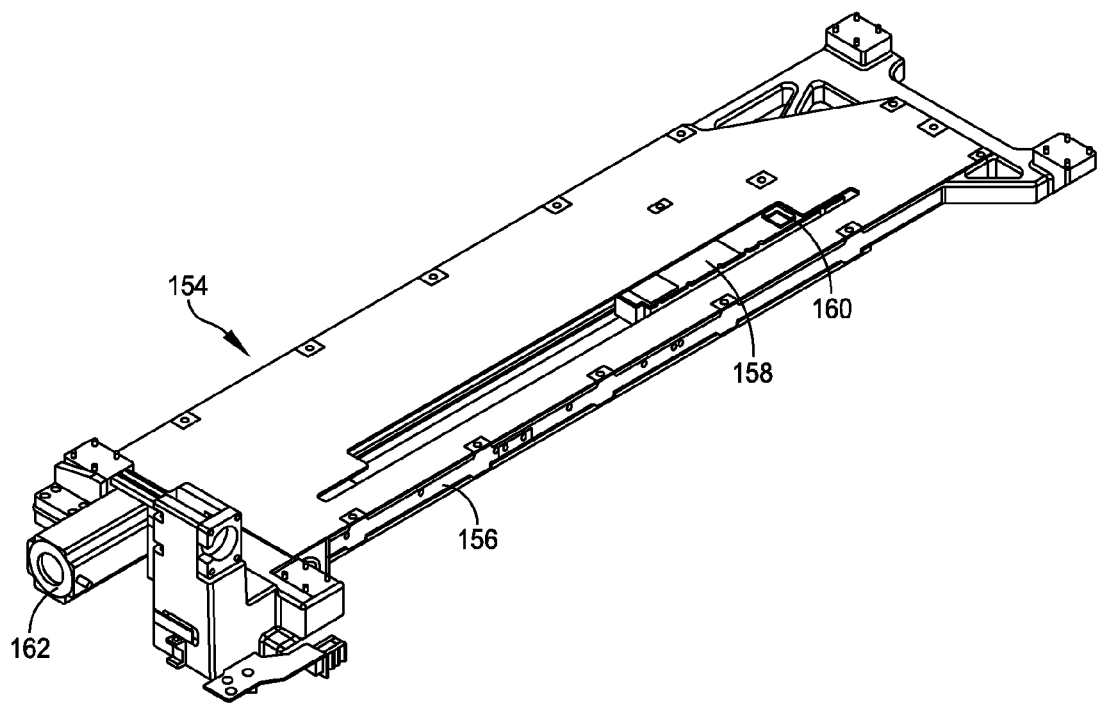
FIG. 14 is a perspective view of a vision system of the stencil printer.

Referring to FIG. 14, a vision system, generally indicated at 154, is shown, with reference to the stencil printer 10 shown in FIG. 1 in which the vision system is obstructed by other components of the stencil printer. As shown, the vision system 154 may be provided for the purposes of aligning the stencil 16 with the circuit board 24 prior to printing and to inspect the circuit board after printing. In one embodiment, the vision system 154 may be disposed between the stencil 16 and the support table 38 of the lift table assembly 22 upon which a circuit board 24 is supported. The vision system 154 is configured to ride along the vision system linear bearings 100 of the left and right shuttle supports 56, 58 to move the vision system. In one embodiment, the vision system 154 includes a beam 156 that extends between left and right shuttle supports 56, 58 to provide back and forth movement of the vision system over the circuit board 24 in a y-axis direction.

The vision system 154 further includes a carriage device 158, which houses a camera 160, and is configured to move along the length of the beam 156 in an x-axis direction. A motor 162 is provided to drive the back and forth movement of the carriage device 158 in the x-axis direction along a length of the beam 156. The construction of the vision system 154 used to move the camera 160 is well known in the art of solder paste printing. The arrangement is such that the vision system 154 may be located at any position below the stencil 16 and above the circuit board 24 to capture an image of predefined areas of the stencil and/or the circuit board, respectively. In other embodiments, when positioning the vision system 154 outside the print position, the vision system may be located above or below the stencil and the circuit board.

Figure 15:
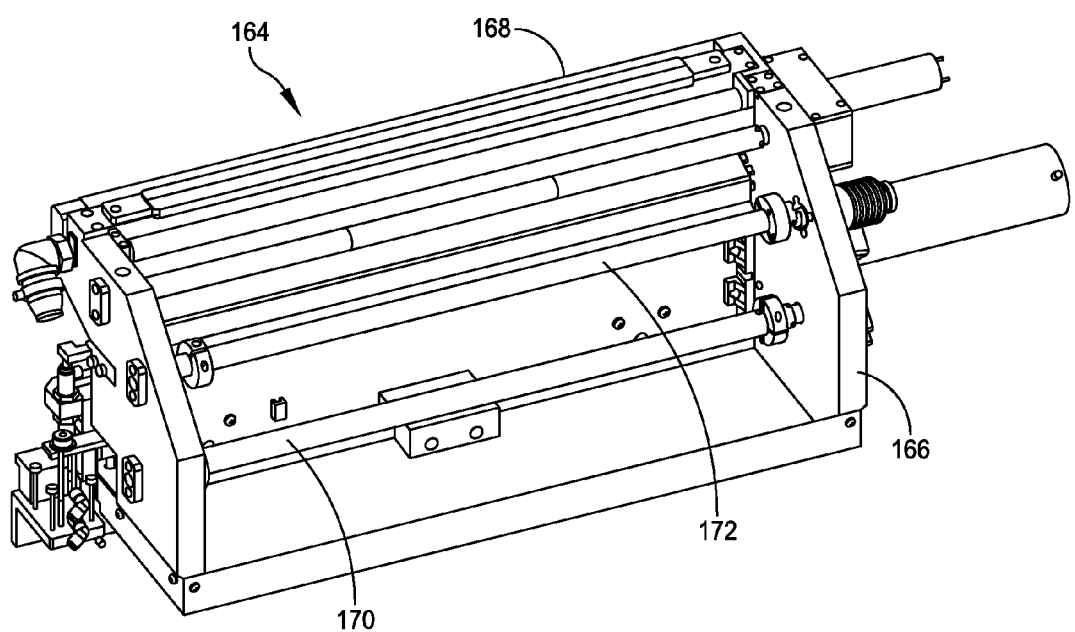
FIG. 15 is a perspective view of a stencil wiper assembly of the stencil printer.

Referring to FIG. 15, in one embodiment of the disclosure, the stencil 16 is cleaned by using a stencil wiper assembly, generally indicated at 164, to remove excess solder paste from the bottom surface of the stencil prior to beginning a print cycle on a next circuit board. Removal of excess solder paste from the stencil 16 can occur after each print cycle, or after a number of print cycles when it has been determined that a substantial amount of solder paste is on the surface of the stencil and should be removed. In the shown embodiment, the stencil 16 is moved in the y-axis direction from the back of the stencil printer 10 to the front of the stencil printer in which the stencil travels over the stencil wiper assembly 164 provided at the front of the stencil printer.

The stencil wiper assembly 164 includes a frame assembly 166, which is configured to support the components of the stencil wiper assembly. The frame assembly 166 is configured to support a vacuum plenum 168, a paper supply 170 that disposes paper over the vacuum plenum, and a solvent application device 172 to apply solvent on the paper. In one embodiment, the paper supply 170 includes a roll of paper housed on a supply roller, a take-up roller for receiving the used paper, and a paper or web material driver for moving the paper across the stencil in a linear direction from the supply roller to the take-up roller. The roll of paper is not shown in FIG. 15 to reveal the components of the stencil wiper assembly 164.

In certain embodiments, the vacuum plenum 168 includes a wiper blade for removing excess solvent and hardened solder paste from the paper as it travels underneath the stencil. In one embodiment, the vacuum plenum 168 of the stencil wiper assembly 164 is configured to move the paper between a first position in which the paper is spaced away from the stencil 16 and a second position in which the paper engages the stencil to wipe and draw excess material from the stencil onto the paper. In another embodiment, the entire stencil wiper assembly 164 is moved up and down to engage the vacuum plenum and the paper to the stencil.

During a cleaning operation, the paper driver rotates the paper supply roller by driving the rotation of the take-up roller, which passes paper over the solvent roller 172 to wet the paper prior to the engagement of the paper to the stencil 16. The solvent impregnated paper is passed to the vacuum plenum 168, which holds the paper in place as the stencil wiper assembly 164 moves under the stencil 16, thereby cleaning the stencil. The vacuum plenum 168 is operable to selectively engage the stencil 16 with the paper being disposed between the vacuum plenum and the stencil. Excess solder paste is wiped off the stencil 16 as the vacuum plenum 168 engages and moves along a length of the stencil with the vacuum plenum drawing excess material from the stencil.

In one embodiment, the stencil 16 may be manipulated to move in an x-axis direction by the actuators 116 to enhance the cleaning of the stencil during a stencil wipe operation with the stencil wiper assembly 164. Specifically, in a certain embodiment, the staging frame 52 and the stencil shuttle 54 are driven toward the front of the stencil printer 10 when a stencil wipe operation is initiated. The stencil shuttle 54 rides on the linear bearings 96 mounted on the left and right shuttle supports 56, 58. Four bearing support points enable free movement of the staging frame 52 while the stencil shuttle 54 is traversing over the stencil wiper assembly 164. Coordinated movement of the three actuators 116 provides controlled movement of the staging frame 52 and the stencil 16 mounted on the staging frame in the x-axis and/or y-axis directions and rotation in the x-y plane (theta). During the stencil wipe process, the stencil wiper assembly 164 is driven up until the paper contacts the stencil 16. The paper is pulled across the vacuum plenum 168 by a paper drive motor of the stencil wiper assembly 164.

During a stencil wipe operation, whether required or initiated by the operator, the stencil shuttle 54 together with the staging frame 52 is driven toward the front of the stencil printer 10 to a wipe start position. The stencil wiper 10 is raised to a wipe height, pressing the wiper paper of the stencil wiper assembly 164 of the stencil wiper 10 against a bottom surface of the stencil 16. The stencil shuttle 54 together with the staging frame 52 is driven further toward the front of the stencil printer 10, dragging the wiper paper of the stencil wiper assembly 164 along the bottom surface of the stencil 16 for cleaning. During the stencil wipe operation, the three staging frame actuators 116 are energized (extended or retracted) individually or in a synchronized manner. This additional motion generates a dual action wiping motion thereby oscillating the stencil, which increases relative motion between wiper paper and the bottom surface of the stencil 16 enhancing the stencil wiping process and more thoroughly cleaning the stencil as the stencil moves over the stencil wiper assembly 164. When the stencil wipe operation (or stroke) is complete, the stencil wiper assembly 164 is lowered, and the stencil shuttle 54 along with staging frame 52 is returned to the back of the stencil printer.

In one configuration, circuit boards that are fed into the stencil printer 10 typically have a pattern of pads or other, usually conductive surface areas onto which solder paste will be deposited. When directed by the controller 26 of the stencil printer 10, the conveyor system 14 supplies circuit boards to a location over the lift table assembly 22 and under the stencil shuttle assembly 18. Once arriving at the position under the stencil shuttle assembly 18, the circuit board 24 is in place for a manufacturing operation. To successfully deposit solder paste on the circuit board 24, the circuit board and the stencil 16 of the stencil shuttle assembly 18 are aligned, via the controller 26. Alignment is accomplished by moving the stencil 16 by the stencil shuttle assembly 18 based on readings from the vision system 154. The vision system 154 can use fiducials, chips, board apertures, chip edges, or other recognizable patterns on the circuit board 24 to determine proper alignment. When the stencil 16 and the circuit board 24 are aligned correctly, the circuit board is raised by the lift table assembly 22 for application of the solder paste through the apertures of the stencil.

The pattern of the apertures on the stencil 16 corresponds to the pattern of conductive surfaces or pads already on the circuit board 24. The print head 20, positioned above the stencil 16, can vary the amount of solder paste delivered on the stencil and applied by the squeegee 144 of the print head as the print head travels across the stencil. The squeegee 144 wipes across the stencil 16, thereby pushing solder paste into the stencil apertures and onto the circuit board 24. Solder paste remains on the circuit board 24 in the preset pattern when the lift table assembly 22 supporting the circuit board moves downward away from the stencil 16, under control of the controller 26. The surface tension between the circuit board 24 and the solder paste causes most of the solder paste to remain on the circuit board when the circuit board and the stencil 16 are separated. The vision system 154 then moves into position over the circuit board 24 to inspect the solder paste deposits to determine whether the solder paste has been accurately placed on the circuit board. Inspection aids in ensuring that the proper amount of material has been deposited on the circuit board 24 and that the material has been deposited at the proper locations on the circuit board. After inspection of the circuit board 24, the controller 26 controls movement of the circuit board to the next location using the conveyor system 14, where electrical components will be placed on the circuit board.

To accomplish improvements and efficiency in the print cycle, the circuit board inspection process and the stencil cleaning process occur substantially in parallel. During the inspection of at least one of the printed circuit boards, the stencil is moved to a position where a stencil wipe process occurs.

During operation, the circuit board 24 is loaded into the stencil printer 10. The stencil 16 and the circuit board 24 are aligned. Alignment of the stencil 16 and the circuit board 24 is accomplished by using the vision system 154. Once aligned, the vision system 154 is moved from its position to a resting position by the vision gantry, and the circuit board 24 and the stencil 16 come into contact via the lift table assembly 22, or substantially close proximity for printing. Printing of solder paste occurs as the print head 20 translates over the surface of the stencil 16 and deposits solder paste through the apertures of the stencil, onto the circuit board 24. The print head 20 can make a full forward sweep and come to a resting position in preparation for a next circuit board 24. Alternatively, the print head 20 can deposit solder paste on the circuit board 24 and return to its starting position.

With solder paste deposited on the surface of the circuit board 24, the circuit board separates from the stencil 16 by dropping away from the surface of the stencil by operating the lift table assembly 22. Having completed printing, the stencil 16 translates, for example toward the front of the stencil printer 10, to be cleaned. While in most known systems the stencil 16 is fixed in position, in the stencil printer 10, the stencil 16 can move in a forward and backward motion. The stencil 16 is cleaned by moving from front to back over the surface of the stencil wiper assembly 164, as the stencil wiper assembly contacts the surface of the stencil and removes excess solder paste. The stencil 16 moves to the front and over the vacuum plenum 168 of the stencil wiper assembly by moving backward in the stencil printer 10, i.e., in the negative y-axis direction, and the stencil moves back into position by moving forward in the positive y-axis direction. This motion is the translation of the stencil 16, although it is possible that translation of the stencil in the stencil printer 10 may occur in the x-axis direction alternatively or additionally. The stencil wiper assembly 164 may be fixed in position to a side of the conveyor system 14, which is the track along which the circuit board 24 is transported through the stencil printer 10. The stencil wiper assembly 164 generally contacts the bottom or undersurface of the stencil where deposits of material may become built up. Preferably, the stencil wiper assembly 164 is positioned toward the front of the stencil printer so as not to interfere with the operation of the stencil 16 and vision system 154. The stencil 16 is positioned at a level above the stencil wiper assembly 164. As the stencil 16 translates rearward, the stencil wiper assembly 164 cleans the surface of the stencil by contacting the stencil while the stencil travels over the stencil wiper assembly and removes the residual solder paste.

During the time in which the stencil 16 is cleaned by the stencil wiper assembly 164, or substantially simultaneously, the vision system 154 moves into a position over the surface of the circuit board 24 to perform an inspection task. The vision system 154 moves in a forward and back motion with respect to the stencil printer 10. The vision system 154 is restricted in its movements to a position over the circuit board 24 while the stencil 16 is being cleaned, since the stencil is moved toward the front of the stencil printer 10, allowing a substantial space over the circuit board for the vision system to inspect. Thus, wiping of the stencil 16 and inspection of the circuit board 24 may be accomplished in parallel. However, it may not be necessary to clean the stencil 16 after each print cycle, so inspection can occur independently of the cleaning of the stencil.

Upon completion of inspection, the circuit board exits the stencil printer 10. The circuit board can exit the stencil printer 10 while the stencil 16 continues to be cleaned. The printing of a circuit board is thereby completed, and the circuit board can continue to a next manufacturing cycle. The stencil printer 10 is prepared to accept a new circuit board via the conveyor system 14, and a next print cycle can begin. While the next circuit board moves into position in the stencil printer 10, the stencil wipe process is completed and the stencil 16 moves towards the back of the stencil printer to begin the printing cycle for the new circuit board.

The process of printing a circuit board including stencil wipe and circuit board inspection can be repeated any number of times to correspond to the number of boards in need of the printing of solder paste. The process may be required at the completion of the printing of a single circuit board, or it may be completed after a predetermined number of circuit boards are printed, as inspection and cleaning may not be necessary after each print cycle.

Due to the relative positioning of the stencil and the vision system, and the ability of the stencil to translate toward the front of the stencil printer, substantially simultaneous operations can occur, thereby reduces the cycle time necessary to complete the printing operation. In addition to improving the cycle time, quality is not compromised, as the circuit boards continue to be inspected.

Embodiments of the disclosure describe a fixed wiper positioned below the stencil that cleans the bottom surface of a stencil when the stencil is translated over the wiper blade. In other embodiments of the disclosure, a wiper is fixed above the surface of the stencil to likewise clean the top surface of the stencil. In still further embodiments of the present disclosure, the stencil translates to a position over the wiper, and the wiper translates orthogonal to the motion of the stencil when the stencil has moved to be positioned over the wiper. In still further embodiments of the disclosure, more than one wiper is fixed in a position below the stencil for cleaning. Other positions of the wiper in relation to the stencil are envisioned.

In a particular embodiment, a method of performing a print operation includes transporting a circuit board on a conveyor system to a print position. Next, the circuit board is lifted to vision height by the lift table assembly. The vision system moves over circuit board, and the camera of the vision system assesses and records circuit board and stencil fiducial locations. Next, the vision system then moves to a park location, and the staging frame actuators perform an x-axis, y-axis and theta adjustments of the stencil position to precisely align its fiducials to the fiducial locations of the circuit board. Once aligned, the circuit board is secured in place and lifted to a print height. Next, the squeegee blade of the print head is lowered and dragged over the stencil to force solder paste through apertures in the stencil onto the circuit board. Once the print stroke is completed, the squeegee blade is raised, and the shuttle transport clamps are engaged to rigidly couple the print head to the stencil shuttle. Next, the print head is then driven forward (along with the stencil shuttle and staging frame) to initiate a stencil wipe operation. The stencil wiper assembly is raised to the wipe height, and the print head (along with the stencil shuttle and staging frame) is driven forward and back over the stencil wiper assembly (that remains stationary) to wipe/clean the stencil and the apertures formed in the stencil. Next, the print head is returned to the print position where a new circuit board is waiting for a stencil print operation.

Embodiments are not limited in their application to the details of construction and the arrangement of components set forth in the following description or illustrated in the drawings. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. A stencil printer for printing viscous materials on electronic substrates, the stencil printer comprising:
    a frame;
    an electronic substrate support coupled to the frame, the electronic substrate support being configured to support an electronic substrate and move the electronic substrate between a lowered position and a raised position;
    a stencil shuttle assembly coupled to the frame, the stencil shuttle assembly being configured to support a stencil and to move the stencil in an x-axis direction between a first position in which the stencil is positioned toward a front of the stencil printer and a second position in which the stencil is positioned toward a back of the stencil printer, the stencil shuttle assembly further being configured to move the stencil in a y-axis direction to align the stencil;
    a print head coupled to the frame, the print head being configured to engage the stencil to dispense a material onto the substrate during a print stroke; and
    a wiper to remove material from the stencil as the stencil is translated away from the substrate by the stencil shuttle assembly,
    wherein the stencil shuttle assembly, when the stencil is translated away from the substrate, is configured to move the stencil in the y-axis direction in an oscillating manner,
    wherein the stencil shuttle assembly includes
        a staging frame configured to receive and secure the stencil thereto,
        a stencil shuttle coupled to the frame and to the staging frame to move the staging frame and the stencil,
        a first actuator configured to move the staging frame with respect to the stencil shuttle in a first direction,
        a second actuator configured to move the staging frame with respect to the stencil shuttle in a second direction, the second direction being generally perpendicular to the first direction, and
        a third actuator configured to move the staging frame with respect to the stencil shuttle in the first direction, the first, second and third actuators being configured to align the stencil and configured to move the stencil in the y-axis direction when translating the stencil, and
    wherein the first, second and third actuators are energized individually or in a synchronized manner to generate a dual action wiping motion, which increases relative motion between wiper paper of the stencil wiper and a bottom surface of the stencil.

2. The stencil printer of claim 1, wherein the stencil shuttle assembly further includes at least one clamp to clamp the staging frame to the stencil shuttle.

3. The stencil printer of claim 1, further comprising a vision system coupled frame to inspect a surface of the substrate.

4. The stencil printer of claim 3, further comprising a controller coupled to the vision system, the first, second and third actuators, and the at least one clamp to move and secure the staging frame with respect to the stencil shuttle in an x-direction, a y-direction and a rotational direction to align the substrate.

5. The stencil printer of claim 4, wherein the stencil shuttle assembly further includes a first pivot pin provided on the staging frame and configured to receive the first actuator, a second pivot pin provided on the staging frame and configured to receive the second actuator, and a third pivot pin provided on the staging frame and configured to receive the third actuator, the first, second and third pivot pins being configured to position the stencil shuttle with respect to the staging frame via the first, second and third actuators.

6. The stencil printer of claim 1, wherein rotational direction of movement is achieved by adjusting the first and third actuators.

7. The stencil printer of claim 1, wherein the stencil shuttle assembly further includes two shuttle supports coupled to the frame and configured to secure the stencil shuttle to the frame.

8. The stencil printer of claim 7, wherein the stencil shuttle assembly further includes at least one clamp to clamp the stencil shuttle to the two shuttle supports.

9. The stencil printer of claim 1, further comprising a drive assembly coupled to the frame and the print head, the drive assembly being configured to move the print head to perform the print stroke and configured to selectively move the stencil shuttle frame between the first and second positions.

10. A method of dispensing viscous material onto an electronic substrate and of cleaning a stencil, the method comprising:

transporting the electronic substrate to a print position;

moving a vision system over the electronic substrate to obtain electronic substrate and stencil fiducial locations;

performing an x-axis, y-axis and rotational adjustment of the stencil position with actuators to precisely align fiducial locations of the stencil with fiducial locations of the electronic substrate;

performing a print stroke with a print head over the stencil to force solder paste through apertures in the stencil onto the electronic substrate;

selectively engaging shuttle transport clamps to rigidly couple the print head to a stencil shuttle assembly that supports the stencil;

moving the print head and the stencil in an x-axis direction toward a stencil wiper assembly to initiate a stencil wipe operation in which the stencil wiper assembly cleans an underside of the stencil; and moving the stencil in the y-axis direction in an oscillating manner, wherein moving the stencil in the y-axis direction includes energizing first, second and third actuators of a stencil shuttle assembly individually or in a synchronized manner to generate a dual action wiping motion.

11. The method of claim 10, further comprising moving the print head in an opposite direction to the print position during the stencil wipe operation.

12. The method of claim 11, further comprising raising the stencil wiper assembly to a wipe height.

13. The method of claim 10, further comprising lifting the electronic substrate to a vision height prior to moving a vision system over the electronic substrate.

14. The method of claim 10, wherein the vision system moves to a park location after obtaining the electronic substrate and stencil fiducial locations.

15. The method of claim 10, further comprising lifting the electronic substrate to a print height prior to performing a print stroke.

16. The method of claim 15, wherein performing a print stroke includes lowering a squeegee blade of the print head prior to the print stroke toward the stencil so that the squeegee blade engages the stencil and raising the squeegee blade after the print stroke away from the stencil.

* * * * *